United States Patent
Fulford, Jr. et al.

[11] Patent Number: 6,066,885
[45] Date of Patent: *May 23, 2000

[54] SUBTRENCH CONDUCTOR FORMED WITH LARGE TILT ANGLE IMPLANT

[75] Inventors: H. Jim Fulford, Jr.; Robert Dawson, both of Austin, Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/191,138

[22] Filed: Nov. 13, 1998

Related U.S. Application Data

[62] Division of application No. 08/652,363, May 23, 1996.

[51] Int. Cl.$^7$ .................................................. H01L 21/762
[52] U.S. Cl. ........................................... 257/508; 438/433
[58] Field of Search ..................... 438/424, 433, 438/434, 262; 257/208, 508, 173, 401

[56] References Cited

U.S. PATENT DOCUMENTS

| | | |
|---|---|---|
| 3,466,741 | 9/1969 | Wiesner . |
| 4,493,740 | 1/1985 | Komeda . |
| 4,653,177 | 3/1987 | Lebowitz et al. . |
| 4,904,609 | 2/1990 | Temple . |
| 4,918,027 | 4/1990 | Fuse et al. . |
| 4,980,310 | 12/1990 | Matsuda et al. . |
| 4,987,093 | 1/1991 | Teng et al. . |
| 4,994,407 | 2/1991 | Custode et al. . |
| 5,010,025 | 4/1991 | Solomon . |
| 5,141,882 | 8/1992 | Komori et al. . |
| 5,173,438 | 12/1992 | Sandhu . |
| 5,212,111 | 5/1993 | Doan . |
| 5,266,510 | 11/1993 | Lee . |
| 5,342,803 | 8/1994 | Shimoji . |
| 5,372,963 | 12/1994 | Mori . |
| 5,378,641 | 1/1995 | Cheffings . |
| 5,401,671 | 3/1995 | Komori et al. . |
| 5,405,788 | 4/1995 | Manning et al. . |
| 5,468,677 | 11/1995 | Jun . |
| 5,482,873 | 1/1996 | Yang . |
| 5,529,948 | 6/1996 | Lur et al. . |
| 5,607,881 | 3/1997 | Huang . |
| 5,624,859 | 4/1997 | Liu et al. . |
| 5,767,000 | 6/1998 | Fulford, Jr. et al. . |

FOREIGN PATENT DOCUMENTS

| | | |
|---|---|---|
| 63-200528 | 8/1988 | Japan . |
| 3-84924 | 4/1991 | Japan . |
| 4-14841 | 1/1992 | Japan . |
| 4-48635 | 2/1992 | Japan . |
| 4-152549 | 5/1992 | Japan . |

*Primary Examiner*—George Fourson
*Attorney, Agent, or Firm*—Conley, Rose & Tayon, P.C.; Robert C. Kowert; Kevin L. Daffer

[57] ABSTRACT

In a semiconductor employing shall trench isolation, a subtrench conductive layer formed before the isolation dielectric is present by implanting dopants into the floor and sidewalls of the shallow trench using a large tilt angle (LTA) implant. The subtrench conductive layer is advantageously used to interconnect what would normally be isolated devices. In lieu of metal or polysilicon interconnects which reside over the isolation dielectric, the subtrench conductive layer is formed entirely within the silicon substrate, and resides beneath and laterally adjacent the isolation dielectric. The conductive layer is formed by implanting ions into the floor and sidewalls of a shallow trench prior to filling the trench with the isolation dielectric. The implantation at specified dosages presents a layer of dopant within the exterior surfaces of the trench sidewalls and floor. Implantation or diffusion of source/drain regions occur after the conductive layer is formed and the isolation dielectric is formed. The source/drain region of a first active area and the source/drain region of a second active area are fashioned so as to intermingle with and be a part of the conductive layer opposing ends. Mutuality of dopants within the source/drain regions interconnected by the conductive layer causes formation of an electrically conductive path across the conductive layer, underneath the isolation dielectric.

20 Claims, 3 Drawing Sheets

SUBTRENCH CONDUCTOR FORMED WITH LARGE TILT ANGLE IMPLANT

This application is a Div of Ser. No. 08/652,363 filed May 23, 1996.

BACKGROUND OF THE INVENTION

1. Field of the Invention

This invention relates to semiconductor fabrication and more particularly to a subtrench conductive layer and method of manufacturing the subtrench conductive layer between source/drain implant regions.

2. Description of the Relevant Art

The fabrication of an integrated circuit involves placing numerous devices in a single semiconductor substrate. Select devices are interconnected by a conductor which extends over a dielectric which separates or "isolates" those devices. Implementing an electrical path across a monolithic integrated circuit thereby involves selectively connecting isolated devices. When fabricating integrated circuits it must therefore be possible to isolate devices built into the substrate from one another. From this perspective, isolation and interconnect routing technologies are two of many critical aspects involved in fabricating a functional integrated circuit.

A popular isolation technology used in metal oxide semiconductor ("MOS") fabrication involves the process of local oxidation of silicon, or "LOCOS". LOCOS process involves oxidizing field regions between devices. The oxide grown in field regions are termed field oxide, wherein field oxide is grown during the initial stages of integrated circuit fabrication, i.e., before source and drain implants are placed in device active areas. By growing a thick field oxide in field regions pre-implanted with a channel-stop dopant, LOCOS processing serves to prevent the establishment of parasitic channels in the field regions.

While LOCOS has remained a popular isolation technology, there are several problems inherent with LOCOS. First, a growing field oxide extends laterally as a bird's-beak structure. In many instances, the bird's-beak structure can unacceptably encroach into the device active area. Second, the pre-implanted channel-stop dopant oftentimes redistributes during the high temperatures associated with field oxide growth. Redistribution of channel-stop dopant primarily affects the active area periphery causing problems known as narrow-width effects. Third, the thickness of field oxide causes large elevational disparities across the semiconductor topography between field and active regions. Topological disparities cause planarity problems which become severe as circuit critical dimensions shrink. Lastly, thermal oxide growth is significantly thinner in small field (i.e., field areas of small lateral dimension) regions relative to large field regions.

Many of the problems associated with LOCOS technology are alleviated by an isolation technique commonly referred to as shallow trench isolation. Despite advances made to decrease bird's-beak, channel-stop encroachment and non-planarity, it appears that LOCOS technology remains inadequate for deep submicron MOS technologies. The shallow trench process is better suited for isolating densely spaced active areas having field regions less than, for example, one micron in lateral dimension.

The shallow trench isolation process involves the steps of etching a silicon substrate surface to a relatively shallow depth, e.g., between 0.2 to 0.5 microns, and then refilling the shallow trench with a deposited dielectric. Some trench processes include an interim step of growing oxide on trench walls prior to the trench being filled with a deposited dielectric. After the trench is filled, it is then planarized to complete the isolation structure. The trench process eliminates bird's-beak and channel-stop dopant redistribution problems. In addition, the isolation structure is fully recessed, offering at least a potential for a planar surface. Still further, field-oxide thinning in narrow isolation spaces does not occur and the threshold voltage is constant as a function of channel width.

Many integrated circuits purposefully circumvent the isolation between specific devices by routing an interconnect line between devices over the isolation dielectric. The interconnect generally contacts a source (or drain) region on one device to the source (or drain) region on another device. The interconnect, generally made of a conductive material such as a refractory metal and/or polysilicon (or metal silicide) serves as a conductor residing within the topography of the integrated circuit.

An interconnect extending along the topography of the integrated circuit, between devices, adds to the non-planarity of the overall structure. An overlying interlevel dielectric must be considerably planarized in order to achieve accurate patterning of subsequent levels of interconnect. It would therefore be desirable to produce a conductive layer which does not reside in the semiconductor topography. That is, the desired conductor must be one which is not formed on top of the isolation dielectric. Accordingly, the desired conductor must not add to the non-planarity of the overall circuit. Further, the desired conductor must be formed entirely within the normal fabrication flow necessary to manufacture an MOS circuit.

SUMMARY OF THE INVENTION

Problems outlined above are in large part solved by a subtrench conductive layer of the present invention. The subtrench conductive layer is one which is formed using a shallow trench process rather than LOCOS. The subfield conductive layer is formed before the shallow trench is filled with an isolation dielectric. Carefully implanted ions are forwarded into the floor and sidewalls of the exposed trench resulting in a conductive liner (or layer) about the trench.

The subtrench conductive layer is advantageously used to interconnect what would normally be isolated devices. In lieu of metal or polysilicon interconnects which reside over the isolation dielectric, the subtrench conductive layer is formed entirely within the silicon substrate, and resides beneath and laterally adjacent the subsequently deposited isolation dielectric. As defined herein, isolation dielectric is one having insulative characteristics, and is interchangeably denoted as a field dielectric or fill dielectric.

The conductive layer is formed by implanting ions into the floor and sidewalls of a shallow trench prior to filling the trench with the isolation dielectric. Ion implantation at specified dosages presents a layer of dopant within the exterior surfaces of the trench sidewalls and floor. Implantation or diffusion of source/drain regions occurs after the conductive layer is formed and the isolation dielectric is formed. The source/drain region of a first active area and the source/drain region of a second active area are fashioned so as to intermingle with and be a part of the conductive layer opposing ends. The selected regions of the first active area and the second active area are of the same conductivity type as the dopants within the conductive layer. For example, select source/drain regions as well as the conductive layer comprise n-type dopants or, alternatively, select source/drain regions and conductive layer dopants can be p-type. Mutuality of dopants within the source/drain regions interconnected by the conductive layer causes formation of an electrically conductive path across the conductive layer, underneath the isolation dielectric.

Broadly speaking, the present invention contemplates a method for forming a conductive layer. The method includes the steps of providing an integrated circuit topography having a shallow trench interposed between a pair of active areas. A masking layer is applied over the active areas to form a partially masked integrated circuit topography. An isolation trench having a depth (d) and a width (w) is then etched into the semiconductor substrate. First dopant ions are directionally introduced into a first sidewall of the trench and into a portion of the shallow trench floor to form a first portion of the subtrench conductive path. First dopant ions are then introduced into the second sidewall and a second portion of the shallow trench floor to form a second portion of the subtrench conductive path. Preferably, the introduction of the first dopant into the first and second sidewalls is accomplished with a large tilt angle (LTA) implant where the angle of the implant is set such that the first portion of the conductive path and the second portion of the conductive path intersect at approximately the center of the worst case trench's floor (where the worst case trench is the trench with the highest aspect ratio or higher d/w). An isolation dielectric is then formed within the shallow trench structure. Formation of the isolation dielectric can be accomplished by filling the implanted trench with a CVD oxide. In one embodiment, the CVD oxide step is preceded by a thermal oxidation step that produces a relatively thin oxide at the sidewalls and floor of the trench. After the shallow trench has been filled with a dielectric (and after a gate oxide layer and a patterned layer of polysilicon have been formed), second dopant ions are then implanted into the active regions of the semiconductor substrate to form source/drain regions whereby the source/drain region of a first active area is electrically connected to the source/drain region of a second active area by a subfield conductive region therebetween. In the presently preferred embodiment, first dopant ions are implanted at a concentration between $1 \times 10^{15}$ to $3 \times 10^{16}$ ions/cm$^2$ at an energy between 80 and 350 keV.

The present invention further contemplates a buried conductor. The buried conductor comprises a conductive region within a silicon substrate arranged beneath and laterally adjacent to an isolation dielectric disposed within the silicon substrate. Dopants are implanted into the conductive region to form the buried conductor. The dopants are of opposite conductivity type than the conductivity of the silicon substrate (i.e., substrate well or substrate bulk areas regions). A portion of a source/drain region of a first active area and a portion of a source/drain of a second source/drain region are shared by the conductive channel. More specifically, the conductivity channel extends between portions of a source/drain region of a first metal-oxide-semiconductor (MOS) device and the source/drain region of a second MOS device. The buried conductor typically comprises a sheet resistance greater than 40 ohms/square, or between 40–120 ohms/square.

BRIEF DESCRIPTION OF THE DRAWINGS

Other objects and advantages of the invention will become apparent upon reading the following detailed description and upon reference to the accompanying drawings in which.

Figure 1:
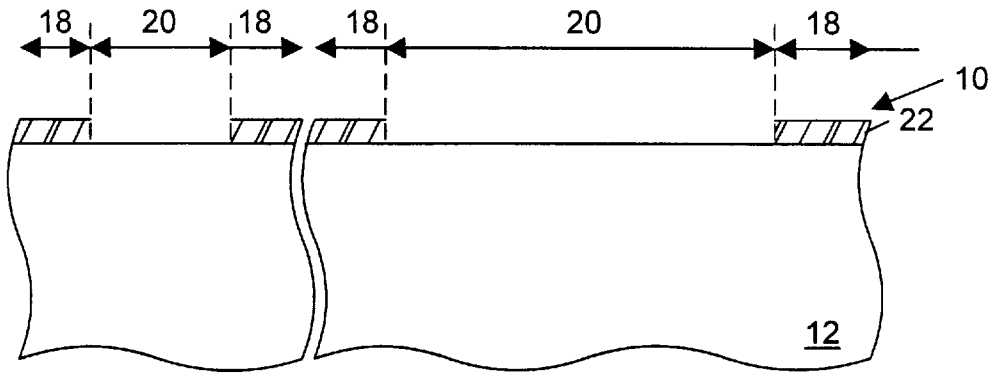
FIG. 1 is a partial cross-sectional view of a semiconductor substrate comprising active regions and isolation regions on which a patterned photoresist layer has been formed to expose the isolation regions.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 9:
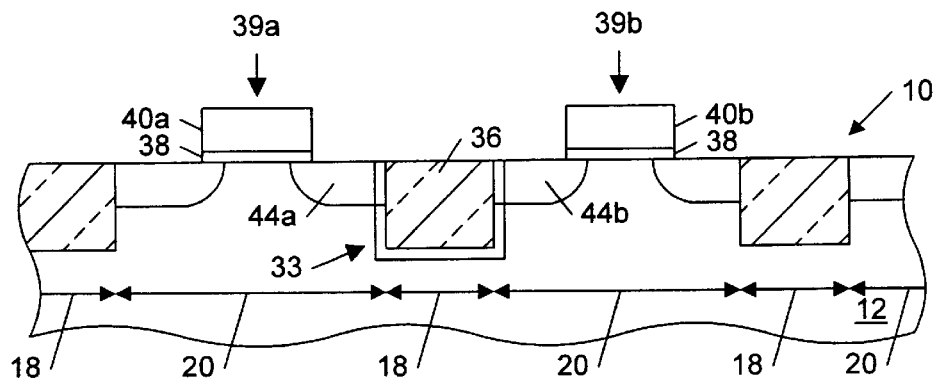
FIG. 9 is a processing step subsequent to FIG. 8 in which a source/drain region of a first MOS device is interconnected by a subtrench conductive channel to a source/drain region of a second device.

Turning briefly to FIG. 9 of the drawings, subtrench conductive path 33 is shown connecting a first source/drain area 44a to a second source/drain area 44b. Subtrench conductive path 33 is arranged beneath and laterally adjacent to isolation dielectric 36. A region of first source/drain region 44a and a region of second source/drain region 44b are shared with respective ends of conductive path 33.

Figure 2:
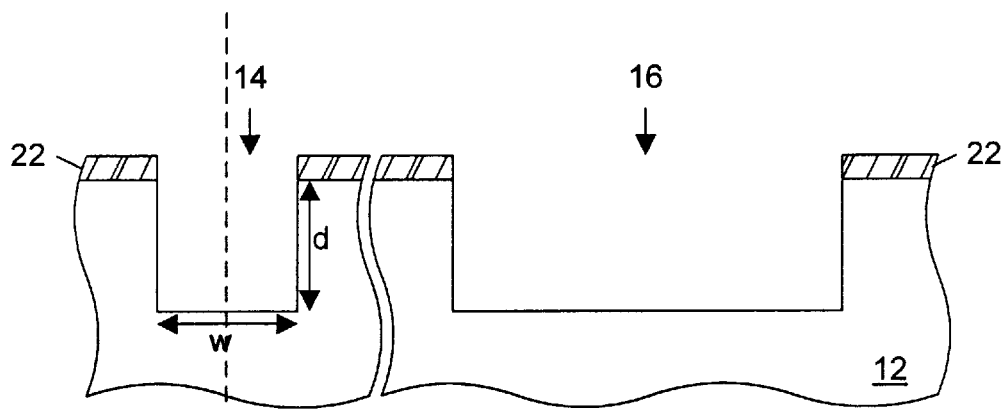
FIG. 2 illustrates a processing step subsequent to that of FIG. 1, in which isolation trenches have been etched into the isolation regions of the semiconductor substrate.

Turning now to FIG. 1, an early stage of a shallow trench isolation process is shown depicting a semiconductor substrate 12 upon which a patterned photoresist layer 22 has been formed. Semiconductor substrate 12 comprises active regions 18 and isolation regions 20. Isolation regions 20 correspond to areas in substrate 12 into which trenches 14 and 16 are formed to electrically isolate individual devices formed within substrate 12. Active areas 18 correspond to regions in which the formation of trenches has been suppressed. Active areas 18 define regions where devices will be formed. Photoresist layer 22 is patterned so as to expose isolation regions 20. In FIG. 2, isolation trenches 14 and 16 have been formed partially into isolation regions 20 of silicon substrate 12. Trenches 14 and 16 are preferably etched into silicon substrate 12 to a depth of between 0.2 to 0.5 microns.

Figure 3:
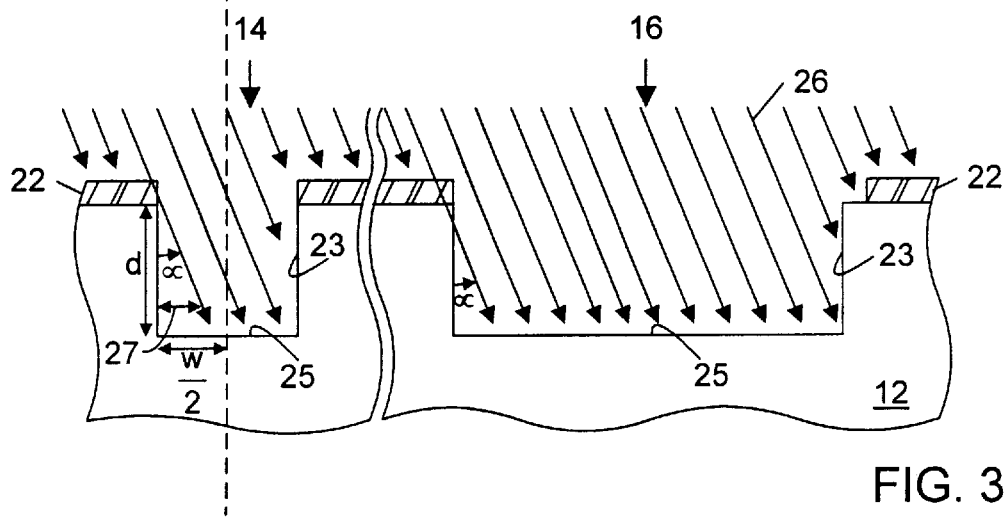
FIG. 3 illustrates a processing step subsequent to that of FIG. 2, in which a first dopant is implanted into a first sidewall and a first portion of the floor of the trench isolation structures at large tilt angle.
Figure 4:
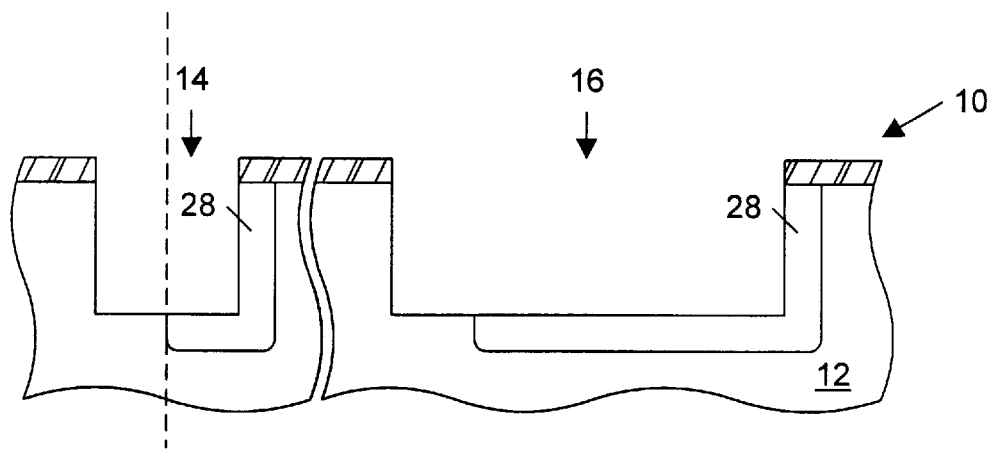
FIG. 4 illustrates a partial cross-sectional view of the semiconductor substrate after completion of the processing step shown in FIG. 3.

Turning now to FIG. 3, a first implant 26 is performed to introduce a first dopant into sidewalls 23 and a first portion of floor 25 of trenches 14 and 16. Implant 26 is performed at an angle α to facilitate the introduction of the first dopant into the sidewalls 23 of trenches 14 and 16. If implant 26 were performed at an angle of 0° or, in other words, at an angle perpendicular to trench floor 25, impurities would be unable to penetrate sidewalls 23 of trenches 14 and 16. Ideally, the angle α should be as great as possible to facilitate introduction of impurities into sidewalls 23. However, there is an upper limit on the angle α. As α increases, the "shadowed" region 27 increases as well. Shadowed region 27 is the region in which implant 26 is unable to penetrate because of the trench geometry. Worst case trench 14 has a depth, d, and a width, w, as shown in FIG. 2. As seen in FIG. 3, the relationship between the angle α, the depth d, and the shadowed region x of trench 14 is such that $\tan(\alpha)=x/d$. To obtain the maximum angle of implant, α should be set such that the shadowed region extends less than one half (or preferably exactly one half) of the width of trench floor 25. Therefore, the optimum process parameters, for implant 26 are dictated by the geometry of worst case isolation trench 14. When α is chosen such than $\tan(\alpha)=w/2d$, the entire trench floor 25 can be completely implanted with impurities using just two mirror image implant steps. If the angle α is increased beyond this critical α, regions of trench floor 25 near the center of worst case trench 14 will receive impurities from neither a first implant 26 nor from a subsequent and symmetrical implant as described below. Thus, angle α is chosen to maximize the implant into sidewalls 23 while enabling the entire trench floor 25 to be implanted using only two implant steps. FIG. 4 shows semiconductor substrate 12 after completion of implant 26. A first portion 28 of a conductive path 33 (shown in FIG. 6) has been formed within the sidewalls and floor of trenches 14 and 16. Impurities that can be used for implant 26 include boron, phosphorus, and arsenic.

Figure 5:
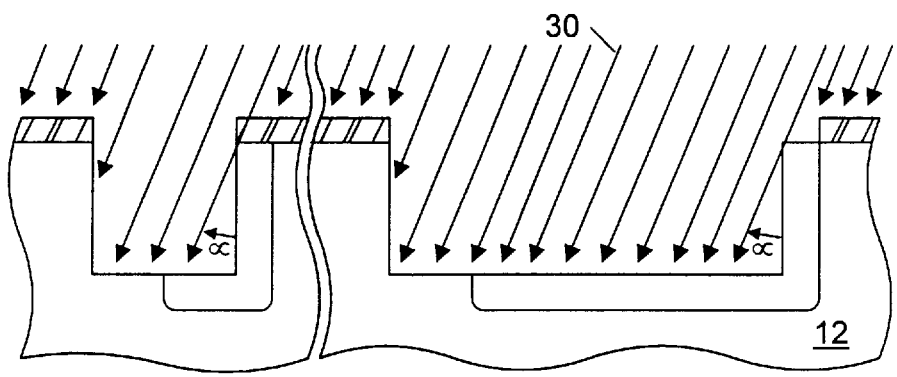
FIG. 5 is a processing step subsequent to FIG. 4 in which a second subtrench implant has been performed to introduce a first dopant into a second sidewall of the trench isolation structure and a second portion of the floor of the trench.
Figure 6:
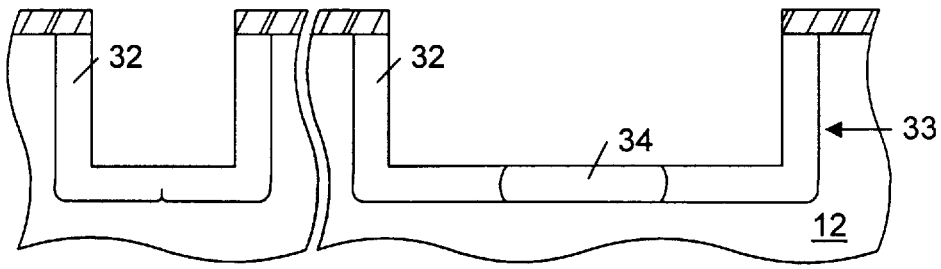
FIG. 6 is a partial cross-sectional view of the semiconductor substrate after the completion of the processing step of FIG. 6 showing the first portion of the conductive path and the second portion of the conductive path intersecting at the center of the worst case aspect ratio trench.

Turning now to FIGS. 5 and 6, a second implant 30 is performed to introduce the first dopant into a second portion 32 of conductive path 33. In the presently preferred embodiment, the second implant is performed by rotating by 180° semiconductor substrate 12 such that the portion of trench floor 25 and sidewall 23 which did not receive impurities from implant 26 are implanted with a second implant 30. Rotation is performed within the same plane as the wafer. The wafer housing is therefore designed to rotate the wafer 180 degrees, either through a continuous motion or in stepped increments from the original implant position shown in FIG. 3 to the second implant position shown in FIG. 5. According to an alternative embodiment, the wafer can be maintained in a stationary position and the implant source changed. The implant source can be tilted at various angles. The implant source angle can change in stepped increments or through a continuous motion from, for example, −90 degrees to +90 degrees.

FIG. 6 shows semiconductor substrate 12 after completion of second implant 30 wherein second half 32 of conductive path 33 has been formed in semiconductor substrate 12. Preferably, conductive path 33 has a substantially equal depth across trench floor 25 and along sidewalls 23. Equal conductive layer thickness on the sides of and below trenches 14 and 16 is desired to ensure uniform conductivity of the conductive path 33. Dosage of dopant impurities used in implants 26 and 30 can be varied to change the conductivity of conductive path 33. A heavier dosage will increase conductivity. In many instances, a resistor may be necessary between isolated devices, wherein conductive path 33 can be doped to a specified resistant value.

Figure 7:
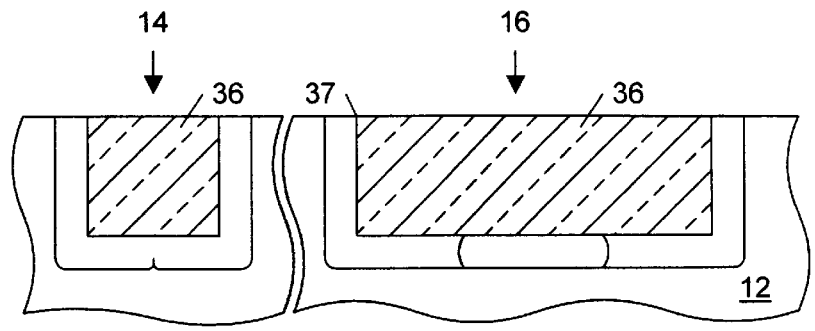
FIG. 7 is a processing step subsequent to FIG. 6 in which the isolation trenches have been filled with a dielectric.

FIG. 7 depicts a processing step subsequent to FIG. 6 in which a fill dielectric 36 has been formed within trenches 14 and 16. Fill dielectric 36 can be comprised of a CVD oxide in one embodiment. In a preferred embodiment of the present invention, deposition of CVD oxide is preceded by a thermal oxidation step to form a relatively thin thermal oxide at the boundaries of trench sidewall 23 and trench floor 25. In a presently preferred embodiment, the thermal oxide would be grown to a thickness of between approximately 50 to 500 angstroms. After trenches 14 and 16 are filled with fill dielectric 36, a planarization step can be performed to create a substantially planar surface.

Figure 8:
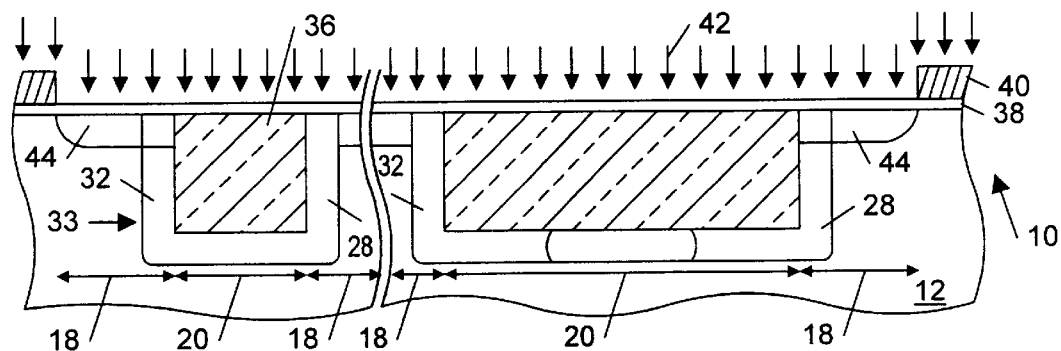
FIG. 8 is a processing step subsequent to FIG. 7 in which a second dopant is introduced into the source/drain regions of the active areas after formation of a gate oxide layer and a patterned layer of polysilicon.

Turning now to FIG. 8, a processing step subsequent to that shown in FIG. 7 is depicted. FIG. 8 shows semiconductor substrate 12 after formation of a gate oxide 38 and a patterned polysilicon layer 40. Gate oxide 38 and polysilicon layer 40 are formed according to processes well known in the art of semiconductor processing. Polysilicon gate 40 is patterned such that individual polysilicon gates are formed intermediate between two adjacent isolation regions 20. FIG. 8 further shows source/drain implant 42 which results in source/drain regions 44 within semiconductor substrate 12. Source/drain implant 42 introduces a second dopant into source/drain region 44. Source/drain regions occur whenever polysilicon layer 40 is absent within active areas 18.

Turning now to FIG. 9, a partial cross-sectional view of semiconductor substrate 12 showing a first transistor 39a comprising first polysilicon gate 40a and first source/drain region 44a and a second transistor is shown as 39b comprising polysilicon gate 40b and source/drain region 44b. Source/drain region 44a of transistor 39a is electrically connected to source/drain region 44b of second transistor 39b by conductive path 33 formed under fill dielectric 36. If the dopant used to form source/drain region 44 is of the same conductivity type (i.e., n-type or p-type) as conductive path 33, then conductive path 33 will form a conductor between adjacent source/drain regions 44 separated by dielectric 36. In this manner, conductive path 33 is used 35 to provide an interconnect between adjacent source/drain regions, wherein the interconnect does not affect the planarity of the upper surface 37 of semiconductor substrate 12.

It would be appreciated to those skilled in the art having the benefit of this disclosure that this invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather a restrictive sense.

What is claimed is:

1. A buried conductor, comprising:

a conductive channel within a silicon substrate arranged beneath and laterally adjacent to an isolation dielectric disposed within the silicon substrate topography, wherein said conductive channel includes dopant ions within the conductive channel to form said buried conductor, and wherein said dopant ions are of opposite conductivity type than the conductivity type of said silicon substrate; and a portion of a first source/drain region and a portion of a second source/drain region which are shared by said conductive region wherein said first and second source/ drain regions share a common conductivity type with said conductive channel, wherein said first and second source/drain regions are part of an integrated circuit.

2. The buried conductor as recited in claim 1, wherein said isolation dielectric comprises an oxide-filled trench formed within said silicon substrate.

3. The buried conductor as recited in claim 1, wherein said dopant ions are n-type and said silicon substrate comprises p-type dopants.

4. The buried conductor as recited in claim 1, wherein said dopant ions are p-type and said silicon substrate comprises n-type dopants.

5. The buried conductor as recited in claim 1, wherein said buried conductor comprises a sheet resistance between 40 to 120 ohms/square.

6. A buried conductor formed by a process comprising:

etching a trench of width (w) to a depth (d) into a semiconductor substrate to form a trench floor between opposed first and second sidewall surfaces;

implanting a first impurity type dopant into said first sidewall surface and into only a first portion of said trench floor to produce a first conductive path;

implanting said first impurity type dopant into said second sidewall surface and into only a second portion of said trench floor adjacent or overlapping the first portion to produce a second conductive path conductively coupled to the first conductive path;

filling said trench with a dielectric; and implanting regions of the semiconductor substrate adjacent the first and second conductor paths and opposed across said trench with a source/drain implant of impurity type the same as the first impurity type dopant.

7. An integrated circuit, comprising:

a first semiconductor device;

a second semiconductor device;

an isolation dielectric within a semiconductor substrate, wherein said isolation dielectric separates said first semiconductor device from said second semiconductor device; and a conductive path within said semiconductor substrate and beneath said isolation dielectric, wherein said conductive path connects a first region of said first semiconductor device to a second region of said second semiconductor device as part of the integrated circuit, wherein said conductive path comprises dopant of the same conductivity type as dopant within said first and second regions.

8. The integrated circuit as recited in claim 7, wherein said first semiconductor device comprises a first source/drain region in said semiconductor substrate and said second semiconductor device comprises a second source/drain region in said semiconductor substrate, wherein said isolation dielectric separates said first source/drain region from said second/source drain region, and wherein said conductive path connects said first source/drain region to said second source/drain region, wherein said conductive path comprises dopant of the same conductivity type as dopant within said first and second source/drain regions.

9. The integrated circuit as recited in claim 8, wherein said dopant is selected from the group consisting of boron, phosphorous, and arsenic.

10. The integrated circuit as recited in claim 8, wherein said first and second source/drain regions abut said isolation dielectric on opposite sides of said isolation dielectric.

11. The integrated circuit as recited in claim 7, wherein said isolation dielectric comprises a fill dielectric within a trench formed within said semiconductor substrate.

12. The integrated circuit as recited in claim 11, wherein said conductive path extends along sidewalls of said trench and beneath a floor of said trench.

13. The integrated circuit as recited in claim 11, wherein said trench has a depth of approximately 0.2 to 0.5 microns.

14. The integrated circuit as recited in claim 11, wherein said fill dielectric has a planar upper surface.

15. The integrated circuit as recited in claim 7, further comprising:

a trench separating said first semiconductor device from said second semiconductor device, wherein said trench is formed within said semiconductor substrate, and wherein said trench comprises sidewalls and a floor; and wherein said isolation dielectric comprises:
a first dielectric layer within said trench; and
a second oxide layer over said first dielectric layer, wherein said first and second oxide layers fill said trench; and wherein said conductive path is formed beneath said trench.

16. The integrated circuit as recited in claim 15, wherein said first dielectric layer is approximately 50 to 200 angstroms thick.

17. The integrated circuit as recited in claim 15, wherein said first dielectric layer is approximately 50 to 500 angstroms thick.

18. The integrated circuit as recited in claim 15, wherein said first dielectric layer comprises a thermal oxide grown on said sidewalls and said floor of said trench, and wherein said second dielectric layer comprises a fill dielectric deposited over said first dielectric layer within said trench.

19. The integrated circuit as recited in claim 15, wherein said trench has a depth of approximately 0.2 to 0.5 microns.

20. The integrated circuit as recited in claim 7, wherein said conductive layer has a sheet resistance of 40 to 120 ohms/square.

* * * * *